(12) United States Patent
Engelhardt

(10) Patent No.: US 6,828,680 B2
(45) Date of Patent: Dec. 7, 2004

(54) INTEGRATED CIRCUIT CONFIGURATION USING SPACERS AS A DIFFUSION BARRIER AND METHOD OF PRODUCING SUCH AN INTEGRATED CIRCUIT CONFIGURATION

(75) Inventor: Manfred Engelhardt, Feldkirchen-Westerham (DE)

(73) Assignee: Infineon Technologies AG, Munich (DE)

( * ) Notice: Subject to any disclaimer, the term of this patent is extended or adjusted under 35 U.S.C. 154(b) by 219 days.

(21) Appl. No.: 09/816,923

(22) Filed: Mar. 23, 2001

(65) Prior Publication Data

US 2001/0026952 A1 Oct. 4, 2001

Related U.S. Application Data

(63) Continuation of application No. PCT/DE99/02927, filed on Sep. 14, 1999.

(30) Foreign Application Priority Data

Sep. 23, 1998 (DE) .......................................... 198 43 624

(51) Int. Cl.[7] .......................................... H01L 23/532
(52) U.S. Cl. ...................... 257/758; 257/700; 257/701; 257/774; 257/704; 257/741; 257/751; 257/753; 257/737; 257/759; 257/760; 257/767; 257/762; 257/763; 257/765; 257/764
(58) Field of Search ................................. 257/758–760, 257/700, 701, 704, 741, 750, 751, 753, 773, 774, 767, 762–765

(56) References Cited

U.S. PATENT DOCUMENTS

| | | | |
|---|---|---|---|
| 5,308,793 A | | 5/1994 | Taguchi et al. |
| 5,612,254 A | | 3/1997 | Mu et al. |
| 5,966,634 A | * | 10/1999 | Inohara et al. ............... 438/687 |
| 5,969,422 A | * | 10/1999 | Ting et al. ................... 257/762 |
| 6,136,682 A | * | 10/2000 | Hegde et al. ............... 438/622 |
| 6,150,272 A | * | 11/2000 | Liu et al. ..................... 438/692 |
| 6,197,688 B1 | * | 3/2001 | Simpson ...................... 438/678 |
| 6,221,780 B1 | * | 4/2001 | Greco et al. ................. 438/702 |
| 6,251,772 B1 | * | 6/2001 | Brown ......................... 438/626 |
| 6,472,304 B2 | * | 10/2002 | Chittipeddi et al. ......... 438/612 |
| 2002/0000665 A1 | * | 1/2002 | Barr et al. ................... 257/758 |
| 2002/0005582 A1 | * | 1/2002 | Nogami et al. ............. 257/758 |
| 2002/0019131 A1 | * | 2/2002 | Ohtsuka et al. ............. 438/687 |
| 2002/0098673 A1 | * | 7/2002 | Yeh et al. .................... 438/618 |

FOREIGN PATENT DOCUMENTS

| | | |
|---|---|---|
| EP | 0 798 778 A2 | 10/1997 |
| EP | 0 892 428 A2 | 1/1999 |

OTHER PUBLICATIONS

"A High Performance 3.97$\mu m^2$ CMOS SRAM Technology Using Self–Aligned Local Interconnect and Copper Interconnect Metallization" (Woo et al.), 1998 Symposium on VLSI Technology Digest of Technical Papers, pp. 12–13.
"A High–Performance Sub–0.25 $\mu$m CMOS Technology with Multiple Thresholds and Cooper Interconnects" (Su et al.), 1998 Symposium on VLSI Technology Digest of Technical Papers, pp. 18–19.

* cited by examiner

Primary Examiner—Alexander Oscar Williams
(74) Attorney, Agent, or Firm—Laurence A. Greenberg; Werner H. Stemer; Ralph E. Locher

(57) ABSTRACT

In an integrated circuit configuration, above a first conductive structure which is embedded in a first insulating layer there are arranged a first barrier layer and a second insulating layer, in which a contact hole is provided which reaches down to the first conductive structure. Above the first barrier layer, the side walls of the contact hole are provided with spacers which act as a diffusion barrier and which reach down to the surface of the first barrier layer. A second conductive structure is arranged in the contact hole. The second conductive structure is conductively connected to the first conductive structure. During the production of the contact hole, the spacers prevent deposition of material from the first conductive structure on the surface of the second insulating layer.

11 Claims, 2 Drawing Sheets

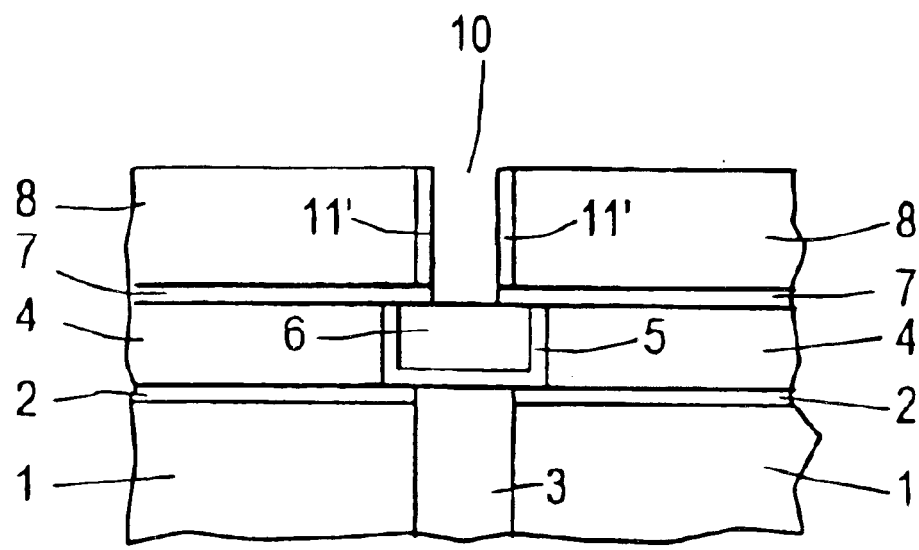
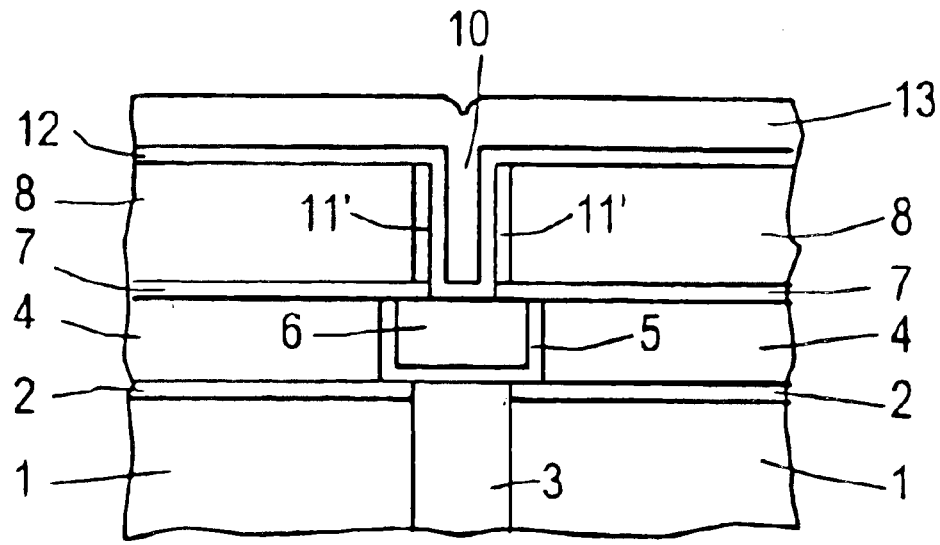

INTEGRATED CIRCUIT CONFIGURATION USING SPACERS AS A DIFFUSION BARRIER AND METHOD OF PRODUCING SUCH AN INTEGRATED CIRCUIT CONFIGURATION

CROSS-REFERENCE TO RELATED APPLICATION

This application is a continuation of copending International Application No. PCT/DE99/02927, filed Sep. 14, 1999, which designated the United States and which was not published in the English language.

BACKGROUND OF THE INVENTION

FIELD OF THE INVENTION

The invention lies in the integrated technology field and relates, more specifically, to an integrated circuit configuration which, in particular, can be implemented by using copper as conductive material.

New materials are increasingly being sought for future use in integrated circuit configurations. Among others, copper is being investigated as conductive material.

In these new materials, one of the problems which arises is that semiconductor wafers, in particular silicon wafers, are contaminated by this material.

It has therefore been proposed (see, for example, M. Woo et al., 1998 Symp. VLSI Technology Digest of Technical Papers, pages 12–13, or L. Su et al., 1998 Symp. VLSI Technology Digest of Technical Papers, pages 18–19), in integrated circuits which contain copper as conductive material, to provide an insulating diffusion barrier between such conductive structures made of copper and the semiconductor substrate and, in the region of contacts of the conductive structure, to provide a conductive barrier to the semiconductor substrate. The intention of these barriers is to prevent diffusion of the contaminating conductive material from the conductive structure to the semiconductor substrate.

Furthermore, it has been proposed to provide diffusion barriers above such conductive copper structures. The barriers are to prevent the diffusion of copper into dielectric layers which are used as so-called intermetallic dielectric between different metalization planes.

In order to produce an integrated circuit having two planes of conductive structures made of copper, it has become known (see for example M. Woo et al., 1998 Symp. VLSI Technology Digest of Technical Papers, pages 12–13 or L. Su et al., 1998 Symp. VLSI Technology Digest of Technical Papers, pages 18–19) firstly to form the lower plane of conductive structures from copper. This lower plane is separated from the semiconductor substrate by diffusion barrier layers, conductive diffusion barriers being used in the region of contacts. An insulating diffusion barrier layer is applied to the entire area of the lower metalization plane, and a further dielectric layer, in which contact holes to the conductive structures of the lower metalization plane are opened, is applied to the insulating diffusion barrier layer. Then, firstly an electrically conductive barrier is applied and then the contact holes are filled with copper.

It has been shown that, even in that structure, contamination of the dielectric layer by copper occurs.

SUMMARY OF THE INVENTION

It is accordingly an object of the invention to provide an integrated circuit configuration and a method of producing the same, which overcome the above-mentioned disadvantages of the heretofore-known devices and methods of this general type and wherein the resulting circuit has at least two conductive structures and in which diffusion of the material from the conductive structures into the surrounding material is avoided. It is a further object of the invention to provide for a method of producing such an integrated circuit configuration.

With the foregoing and other objects in view there is provided, in accordance with the invention, an integrated circuit configuration, comprising:

an insulating layer formed on a substrate;

a first conductive structure embedded in the insulating layer;

a diffusion barrier layer and a second insulating layer disposed above the first conductive structure and being formed with a contact hole reaching as far as the first conductive structure and having side walls;

a second conductive structure disposed in the contact hole and conductively connected to the first conductive structure; and spacers formed on the side walls of the contact hole above the diffusion barrier layer, the spacers acting as a barrier to diffusion of a material from the first conductive structure into the second insulating layer and reaching as far as a surface of the diffusion barrier layer.

In other words, there is provided in the circuit configuration according to the invention a first conductive structure, which is embedded in a first insulating layer. Above the first conductive structure there are arranged a diffusion barrier layer and a second insulating layer, in which a contact hole is provided which reaches as far as the first conductive structure. Above the diffusion barrier layer, the side walls of the contact hole are provided with spacers which act as barriers to diffusion of the material from the first conductive structure into the second insulating layer and which reach as far as the surface of the diffusion barrier layer. A second conductive structure, which is conductively connected to the first conductive structure, is arranged in the contact hole.

In order to produce an integrated circuit configuration of this type, the diffusion barrier layer is applied to a substrate which has at least the first insulating layer with the first conductive structure. The second insulating layer is applied to the diffusion barrier layer. The contact hole is etched in the second insulating layer, above the first conductive structure, in which hole the surface of the first conductive structure is covered with the diffusion barrier layer. Then, on the side walls of the contact hole, the spacers are formed, which act as barriers to diffusion of the material from the first conductive structure into the second insulating layer. Then, the contact hole is opened as far as the surface of the first conductive structure and provided with the second conductive structure.

Since the side walls of the contact hole are covered with the spacers, which have a diffusion barrier effect, before the surface of the first conductive structure is exposed in the contact hole, in this circuit configuration the situation is avoided where, when the contact hole is opened, material removed at the surface of the first conductive structure during the opening of the contact hole is deposited onto the side walls of the second insulating layer. Depositions of this type during the etching of the contact hole are considered to be responsible for the fact that, in the circuit configurations produced in accordance with known methods, in spite of the use of diffusion barriers, contamination of the dielectric layers occurs. In the method according to the invention, such deposition can take place only at the surface of the spacers or of the diffusion barrier layer. Since the spacers and the diffusion barrier layer constitute a diffusion barrier, contamination of the second insulating layer is effectively prevented.

In accordance with an added feature of the invention, the spacers are electrically conductive, that is, the spacers are preferably formed from electrically conductive material with a diffusion barrier effect. In this case, the effective conduction cross section of the second conductive structure is enlarged by the spacer cross-sectional area.

In order to avoid short circuits between the first conductive structure and adjacent conductive structures, it is advantageous to provide the diffusion barrier layer from an insulating diffusion barrier material, in particular SiN or SiON.

In accordance with an additional feature of the invention, an electrically conductive first diffusion barrier structure adjoins the first conductive structure at least beneath and to a side thereof and acts as a barrier to diffusion of material from the first conductive structure.

In accordance with another feature of the invention, an electrically conductive second diffusion barrier structure adjoins the second conductive structure at least beneath the second conductive structure and acts as a barrier to diffusion of material from the second conductive structure.

In accordance with a further feature of the invention:

the first conductive structure and/or the second conductive structure contain copper, silver, gold, platinum, or palladium;

the spacers, and/or the first diffusion barrier structure, and/or the second diffusion barrier structure contain Ta, TaN, Ti, or TiN; and the diffusion barrier layer and/or the spacers contain SiN or SiON.

More generally, the circuit configuration according to the invention, and the method for its production, can advantageously be applied when using materials for the first conductive structure and/or the second conductive structure which exhibit high diffusion into adjacent material. In particular, the circuit configuration and the method for its production can advantageously be applied when using copper, silver, gold, platinum or palladium for the first conductive structure and/or the second conductive structure.

All materials with a diffusion barrier effect are suitable for the spacers, in particular SiN, SiON, Ta, TaN or Ti or TiN, conductive materials being preferred with regard to the conduction cross section.

With the above and other objects in view there is also provided, in accordance with the invention, a method of producing an integrated circuit configuration. The method comprises the following steps:

forming a diffusion barrier layer on a substrate having at least a first insulating layer with a first conductive structure embedded therein;

forming a second insulating layer on the diffusion barrier layer;

etching a contact hole into the second insulating layer above the first conductive structure, wherein the surface of the first conductive structure is covered with the diffusion barrier layer within the hole;

forming spacers on side walls of the contact hole, the spacers acting as a barrier to diffusion of a material from the first conductive structure into the second insulating layer;

opening the contact hole as far as a surface of the first conductive structure; and forming in the contact hole a second conductive structure conductively connected to the first conductive structure.

The first conductive structure preferably adjoins a first diffusion barrier structure which is electrically conductive and which is arranged at least beneath and to the side of the first conductive structure and which acts as a barrier to diffusion of the material from the first conductive structure into adjacent material. In particular, Ta, TaN, Ti or TiN are suitable for the first diffusion barrier structure.

Moreover, it is advantageous, beneath the second conductive structure, to provide a second diffusion barrier structure which is electrically conductive and which adjoins the second conductive structure underneath and acts as a barrier to diffusion of the material from the second conductive structure. In particular, Ta, TaN, Ti or TiN are also suitable for the second diffusion barrier structure.

Other features which are considered as characteristic for the invention are set forth in the appended claims.

Although the invention is illustrated and described herein as embodied in an integrated circuit configuration and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a section through the semiconductor substrate after exposure of the surface of the first conductive structure within the contact hole; and FIG. 5 is a section through the semiconductor substrate after the formation of a second conductive structure.

DESCRIPTION OF THE PREFERRED EMBODIMENTS

Figure 1:
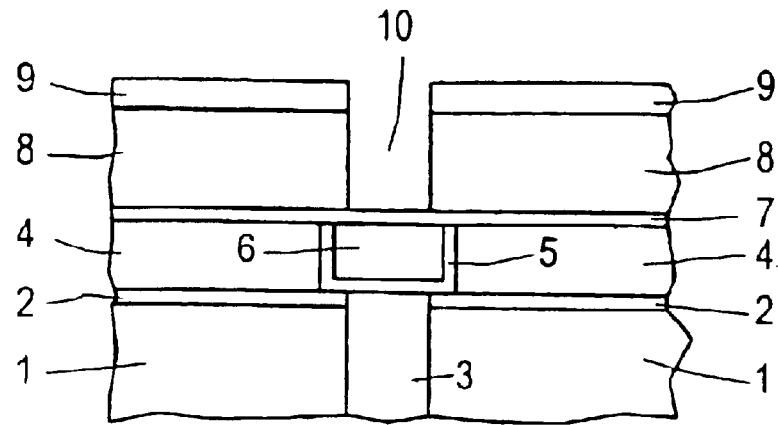
FIG. 1 is a section through a substrate having a first insulating layer, in which a first conductive structure is embedded, having a diffusion barrier layer, which covers the first conductive structure, and having a second insulating layer, in which a contact hole is opened as far as the surface of the diffusion barrier layer.

Referring now to the figures of the drawing in detail and first, particularly, to FIG. 1 thereof, there is seen a semiconductor substrate which has at least one passivation layer 1 and an insulating diffusion barrier layer 2 formed on the passivation layer 1. The semiconductor substrate consists of substantially monocrystalline silicon, the passivation layer 1 of $SiO_2$ and the insulating diffusion barrier layer 2 of SiN. Provided in the passivation layer 1 and the insulating diffusion barrier layer 2 is a terminal 3 made of polysilicon or tungsten, which is provided in order to make contact with a component implemented in the semiconductor substrate underneath the passivation layer 1.

Applied to the surface of the insulating barrier layer 2 are a first insulating layer 4 of $SiO_2$ or an organic or inorganic material with a lower dielectric constant than $SiO_2$—known in the art as so-called low k material—for which polyamide or substances with the commercial designation PBO, BCB, Flowfill or Silk are suitable, in a layer thickness of 0.1 μm to 2 μm. Formed in the first insulating layer 4 (formed by building an opening, depositing a first conductive barrier layer of Ta and depositing a copper layer, and also subsequent chemical mechanical polishing until the surface of the first insulating layer 4 is exposed) are a first diffusion barrier structure 5 and a first conductive structure 6. The first diffusion barrier structure 5 adjoins the sides and the bottom of the first conductive structure 6. It prevents any diffusion of the copper from the first conductive structure 6 into the first insulating layer 4, and also into the terminal 3 located underneath and, via the latter, into the semiconductor substrate. The first conductive structure 6 is embedded in the first insulating layer 4.

Next, a first diffusion barrier layer 7 of SiN is applied in the lowest possible layer thickness of typically <100 nm, preferably 10 to 50 nm. Applied to the diffusion barrier layer 7 is a second insulating layer 8 of $SiO_2$ or a low k material in a layer thickness of 0.1 μm to 2 μm. With the aid of an etching mask 9, a contact hole 10 is opened in a plasma etching process, the hole being arranged above the first conductive structure 6 and reaching as far as the surface of the diffusion barrier layer 7.

If the second insulating layer 8 consists of $SiO_2$, the etching mask 9 is formed of photoresist, polyimide or photoimide, and the plasma etching process is carried out by using an etching gas containing $CF_4$, $CHF_3$ and/or $C_4F_8$.

If the second insulating layer 8 consists of low k material, the etching mask 9 is formed of $SiO_2$, SiN or SiON, and the plasma etching process is carried out with an etching gas containing $O_2$ with the addition of $N_2$, $CF_4$ or the like.

Figure 2:
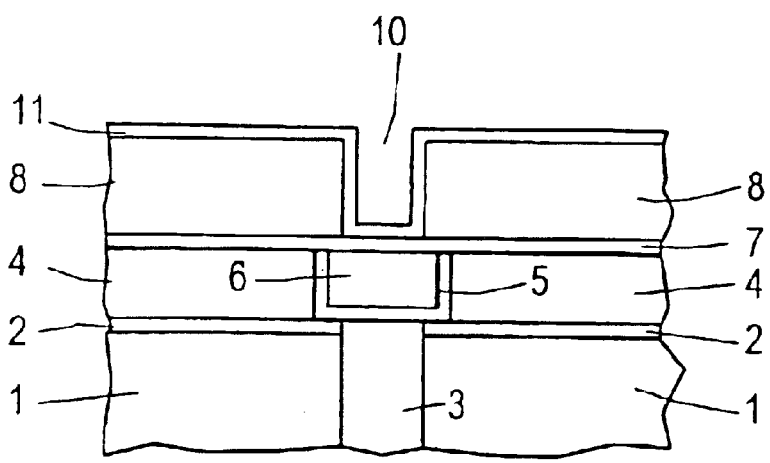
FIG. 2 is a section through the substrate after the deposition of a conformal barrier layer.

With reference to FIG. 2: After the etching mask 9 has been removed, a conformal diffusion barrier layer 11 of Ta is deposited, in a layer thickness of 10 to 50 nm, by means of PVD (Physical Vapor deposition) or CVD (Chemical Vapor deposition).

Figure 3:
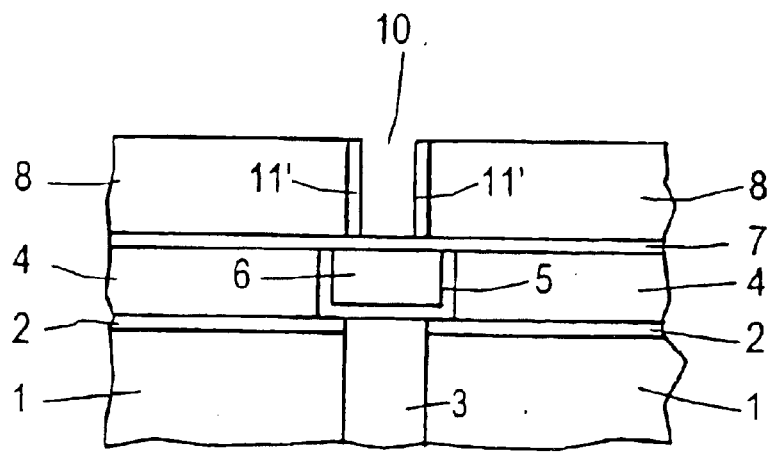
FIG. 3 is a section through the semiconductor substrate after the formation of spacers with a diffusion barrier effect on the side walls of the contact hole.

By means of anisotropic etching with fluorine chemistry ($CF_4$, $CHF_3$, for example $CF_4+O_2$), spacers 11' are formed from the conformal barrier layer 11 on the side walls of the contact hole 10. The spacers 11' consist of TaN and have a diffusion barrier effect against copper (see FIG. 3). The spacers 11' reach as far as the surface of the first diffusion barrier layer 7.

By means of anisotropic etching with fluorine chemistry, the diffusion barrier layer 7 is structured, so that the contact hole 10 reaches as far as the surface of the first conductive structure 6. During this etching step, that surface of the second insulating layer 8 that faces the contact hole is covered with the spacers 11', so that any deposition of material removed at the surface of the first conductive structure 6 onto the flanks of the second insulating layer 8 which face the contact hole 10 is avoided (see FIG. 4). Alternatively, the etching of the spacers 11' and the structuring of the diffusion barrier layer 7 can be carried out in one etching step.

Then, a second conductive diffusion barrier layer is deposited which covers the surface of the second insulating layer 8, the spacers 11' and the exposed surface of the first conductive structure 6. The second conductive diffusion barrier layer is formed of TaN, in a layer thickness of 10 nm to 50 nm, by means of PVD or CVD deposition. By depositing a further copper layers which fills up the remaining clearance in the contact hole 10, and structuring the copper layer and the second conductive diffusion barrier layer arranged underneath it, a second diffusion barrier structure 12 and a second conductive structure 13 are formed, the latter being conductively connected to the first conductive structure 6 (see FIG. 5). The second conductive structure 13 is configured as a conductor track belonging to a metalization plane.

I claim:

1. An integrated circuit configuration, comprising:
   an insulating layer;
   a first conductive structure embedded in said insulating layer;
   a diffusion barrier layer and a second insulating layer disposed above said first conductive structure and being formed with a contact hole reaching as far as said first conductive structure and having side walls;
   a second conductive structure disposed in said contact hole and conductively connected to said first conductive structure; and
   spacers formed on said side walls of said contact hole above said diffusion barrier layer, said spacers acting as a barrier to diffusion of a material from said first conductive structure into said second insulating layer and reaching as far as a surface of said diffusion barrier layer.

2. The circuit configuration according to claim 1, wherein said spacers are electrically conductive.

3. The circuit configuration according to claim 1, which further comprises an electrically conductive first diffusion barrier structure adjoining said first conductive structure at least beneath and to a side thereof and acting as a barrier to diffusion of material from said first conductive structure.

4. The circuit configuration according to claim 3, which further comprises an electrically conductive second diffusion barrier structure adjoining said second conductive structure at least beneath said second conductive structure, said electrically conductive second diffusion barrier structure acting as a barrier to diffusion of material from said second conductive structure.

5. The circuit configuration according to claim 4, wherein
   at least one of said first conductive structure and said second conductive structure contain a material selected from the group consisting of copper, silver, gold, platinum, and palladium;
   at least one of said spacers, said first diffusion barrier structure, and said second diffusion barrier structure contain a material selected from the group consisting of Ta, TaN, Ti, and TiN; and
   one of said diffusion barrier layer and said spacers contain a material selected from the group consisting of SiN and SiON.

6. The circuit configuration according to claim 1, which further comprises an electrically conductive diffusion barrier structure adjoining said second conductive structure at least beneath said second conductive structure, said electrically conductive second diffusion barrier structure acting as a barrier to diffusion of material from said second conductive structure.

7. A method of producing an integrated circuit configuration, which comprises:
   forming a diffusion barrier layer on a substrate having at least a first insulating layer with a first conductive structure embedded therein;
   forming a second insulating layer on the diffusion barrier layer;

forming a contact hole into the second insulating layer above the first conductive structure, wherein the surface of the first conductive structure is covered with the diffusion barrier layer within the hole;

forming spacers on side walls of the contact hole, the spacers acting as a barrier to diffusion of a material from the first conductive structure into the second insulating layer;

opening the contact hole as far as a surface of the first conductive structure; and forming in the contact hole a second conductive structure conductively connected to the first conductive structure.

8. The method according to claim 7, which comprises forming the spacers of electrically conductive material.

9. The method according to claim 7, which comprises forming the first electrically conductive structure by applying the first insulating layer to the substrate;

producing an opening with a bottom and side walls in the first insulating layer;

depositing and structuring a first conductive barrier layer for forming an electrically conductive first diffusion barrier structure covering the bottom and the side walls of the opening; and forming the first conductive structure by filling the opening with conductive material.

10. The method according to claim 9, which comprises depositing a second conductive barrier layer after the contact hole has been opened as far as the surface of the first conductive structure;

depositing a conductive layer;

structuring the conductive layer and the second conductive barrier layer, and thereby forming the second conductive structure and a second diffusion barrier structure arranged underneath the second conductive structure.

11. The method according to claim 7, which comprises:

forming one of the first conductive structure and the second conductive structure with a material selected from the group consisting of copper, silver, gold, platinum, and palladium;

forming one of the spacers, the first diffusion barrier structure, and the second diffusion barrier structure with a material selected from the group consisting of Ta, TaN, Ti, and TiN; and forming one of the diffusion barrier layer and the spacers with a material selected from the group consisting of SiN and SiON.

\* \* \* \* \*